United States Patent [19]

Alais et al.

[11] 3,958,324

[45] *May 25, 1976

[54] METHOD FOR THE MANUFACTURING OF THERMOELECTRIC MODULES

[75] Inventors: Michel Alais; Andre Stahl, both of Orsay, France

[73] Assignee: Compagnie Industrielle des Telecommunications Cit-Alcatel, Paris, France

[ * ] Notice: The portion of the term of this patent subsequent to Dec. 3, 1991, has been disclaimed.

[22] Filed: Jan. 22, 1975

[21] Appl. No.: 543,108

[30] Foreign Application Priority Data

Feb. 15, 1974 France .............................. 74.05257

[52] U.S. Cl. .............................. 29/573; 228/180 R; 228/160
[51] Int. Cl.² .......................................... B01J 17/00
[58] Field of Search .............. 29/573; 228/180, 259, 228/160

[56] References Cited
UNITED STATES PATENTS

| | | |
|---|---|---|
| 2,980,746 | 4/1961 | Claydon ........................... 29/573 X |
| 3,276,105 | 10/1966 | Alais et al. ........................... 29/573 |
| 3,279,036 | 10/1966 | Fuller ................................... 29/573 |
| 3,509,620 | 5/1970 | Phillips ................................ 29/573 |
| 3,626,583 | 12/1971 | Abbott et al. ......................... 29/573 |
| 3,851,381 | 12/1974 | Alais et al. ........................... 29/573 |

*Primary Examiner*—Al Lawrence Smith
*Assistant Examiner*—K. J. Ramsey
*Attorney, Agent, or Firm*—Sughrue, Rothwell, Mion, Zinn and Macpeak

[57] ABSTRACT

Method for the manufacturing of thermoelectric modules, consisting in assembling a succession of alternate plates of P type and of N type separated by insulating sheets, of which one in two protrudes beyond the upper face of the assembly, the others protruding beyond the lower face. After immersion of these two faces in the brazing material to establish junctions separated by insulating sheets, the assembly is cut up into thin slices, orthogonally to the plates and one thin slice in two is overturned before the cementing of the slices together. The invention is used in heart stimulators.

7 Claims, 8 Drawing Figures

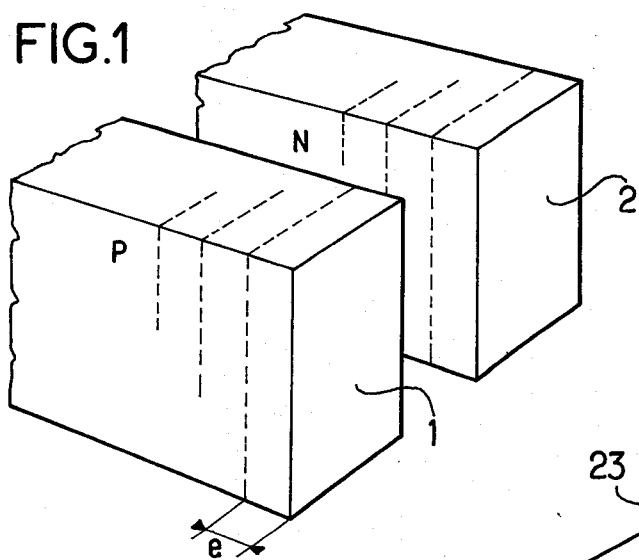
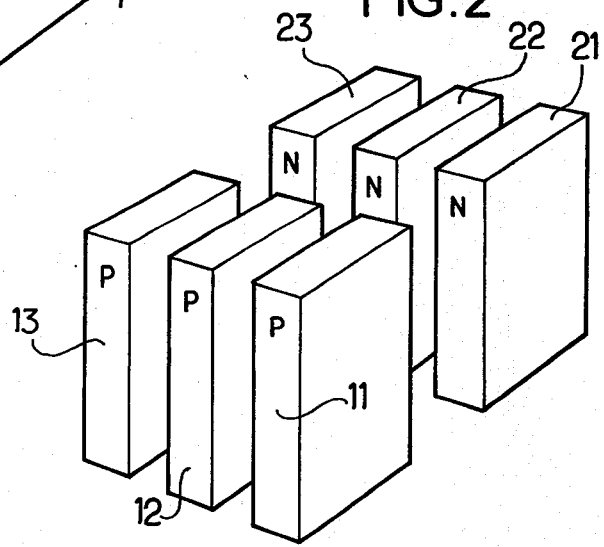
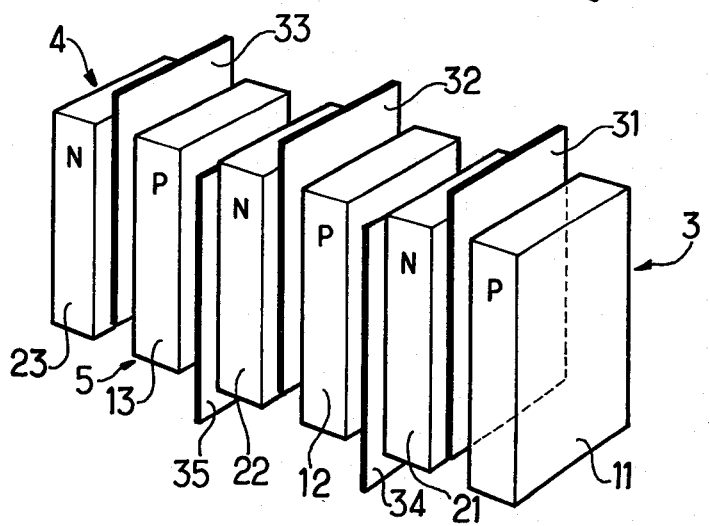

METHOD FOR THE MANUFACTURING OF THERMOELECTRIC MODULES

The present invention relates to a method for manufacturing thermoelectric modules.

It is known that it is current to use, in thermoelectric conversion generators or in Peltier effect refrigeration devices, thermoelectric modules consisting of bars of P type and of N type, juxtaposed, whose cross-section is close to a square and between which electrical junctions have been provided.

These electrical junctions are formed either manually or by means of relatively complicated automatic devices, for example, with laser cutting.

The method according to the invention makes it possible to produce these junctions in a particularly simple way. On the other hand, that method, without being as quick as entirely automatic methods, makes it possible to obtain a great saving of time in relation to the manual method.

The method according to the invention is a method for manufacturing thermoelectric modules from blocks of P type and of N type having a parallelepipedical shape, having the same dimensions, consisting in:

Cutting up those parallelepipedical blocks parallel to one of their faces into plates of P type and plates of N type;

Assembling alternately the same number of plates of P type and of N type after having inserted between the adjacent faces very thin insulating sheets having the same dimensions as the strips, to form a stack;

Cutting up that stack into thin slices, formed by rods in planes perpendicular to the faces of the P and N plates.

Forming a parallelepipedic stack by assembling in a parallel configuration a certain number of these slices after having inserted between the adjacent faces very thin insulating sheets so as to place successively a slice beginning with a P rod then a slice beginning with an N rod;

characterized in that the insulating sheets inserted between the P and N plates are arranged alternately so as to be substantially recessed in relation to the plates on one face of the stack and slightly protruding on the other face and in that the said opposite faces of the said stack from which the insulating sheets protrude are immersed in brazing material before the cutting up of the said stack.

When the opposite faces of the P and N stack from which the insulating sheets protrude are immersed in the brazing material, junctions are formed between the strips of P type and the strips of N type.

Subsequent to the cutting up of that P and N stack into thin slices, in a direction perpendicular to the faces of the P and N plates, each slice being formed by a sequence of P and N rods, each of the P rods being connected by a junction to the neighbouring N rods.

The following description with reference to the accompanying figures will make it easier to understand how the invention can be implemented, in which:

FIG. 1 shows the two blocks, P and N, at the outset;

FIG. 2 shows the two blocks, P and N, cut up into plates;

FIG. 3 shows the P and N stack;

FIG. 1 shows the P type block 1 and the N type block 2. These blocks are parallelepipedical and have the same dimensions.

Figure 4:
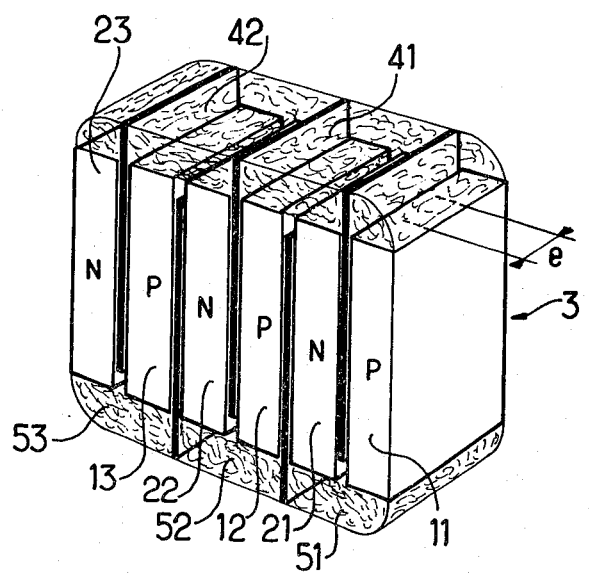
FIG. 4 shows the P and N stack after immersing in the brazing material.

The lower and upper faces of the blocks 1 and 2 are tin-plated for example using a given brazing material BiSnSb whose melting point is close to 300° C. It would also be possible to replace the tin plating by nickel plating.

The block 1 is cut up into P plates having a thickness $e$ such as 11, 12, 13 (see FIG. 2) and the block 2 is also cut up into N plates having a thickness $e$ such as 21, 22, 23 (see FIG. 2).

The cutting up planes are orthogonal to the tin plated faces.

The P plates (11, 12, 13) and the N plates (21, 22, 23) in equal numbers are stacked onto one another and form a P and N stack 3 constituted by an alternate sequence of P plates and N plates.

Insulating sheets having the same dimensions as the plates are arranged between two consecutive plates.

The sheets 31, 32, 33 arranged between the plates 11, 21, between the plates 12, 22 and between the plates 13, 23 protrude slightly beyond the upper face 4 of the stack 3 and are recessed in relation to the lower face 5.

The sheets 34 and 35 arranged between the plates 21 and 12 and between the plates 22 and 13 protrude slightly beyond the lower face 5 of the stack 3 (see FIG. 3).

The stack can be held by a mechanical pressure means but sheets consisting of a polyimide film coated with polytetrafluorethylene withstanding brazing temperatures can also be used.

FIG. 3 shows the stack 3 after immersion of the upper face 4 and lower face 5 in the brazing material. Bridge 41 is formed between the plates 21 and 12 and bridge 42 is formed between the plates 22 and 13 and on the lower surface 5, bridge 51 is formed between the plates 11 and 21 and bridge 52 is formed between the plates 12 and 22 and bridge 53 is formed between the plates 13 and 23.

After that operation, the stack 3 is cut up along planes perpendicular to the insulating sheets in thin slices 6 having a thickness $e$.

Figure 5:
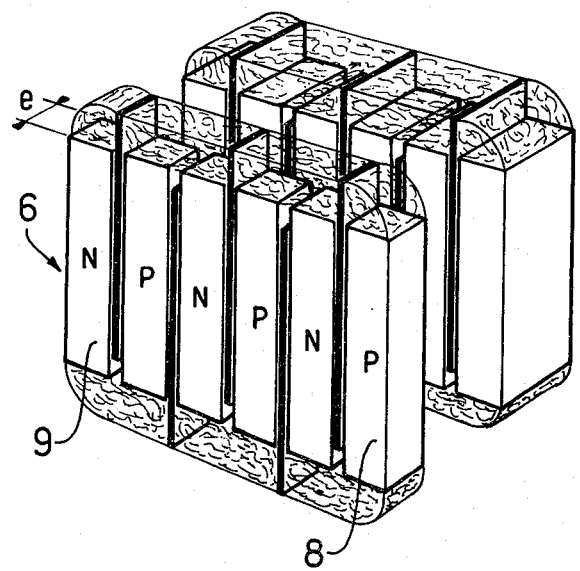
FIG. 5 shows the P and N stack after cutting up into thin slices.

Each slice thus obtained begins with a rod P8 and ends with a rod N9 (see FIG. 5).

One slice in two is overturned, that is, the second, the fourth, the sixth, etc..., so that these slices begin with a rod N9.

Insulating sheets 60, which are very thin and protrude slightly beyond the top and the bottom of the slices thus assembled are inserted between the slices.

To obtain a thermoelectric module 100, epoxy cement fixing the slices to the insulating sheets 60 may be used, the excess cement being removed by simple pressure.

Figure 6:
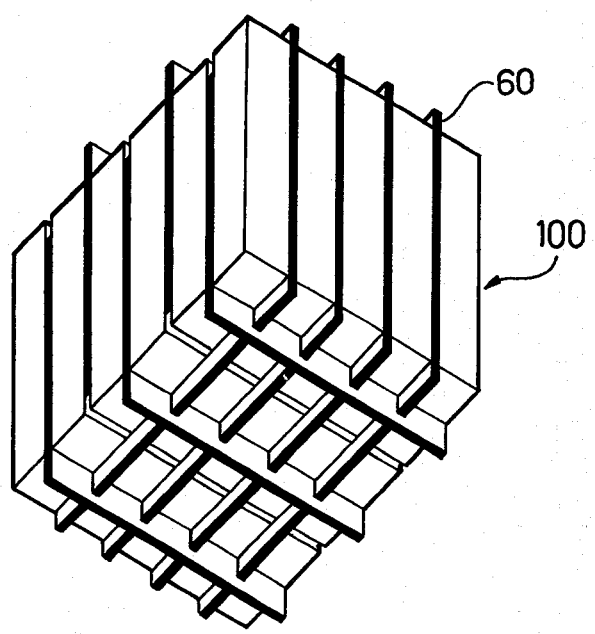
FIG. 6 shows the thermoelectric module obtained by stacking the thin slices.
Figure 7:
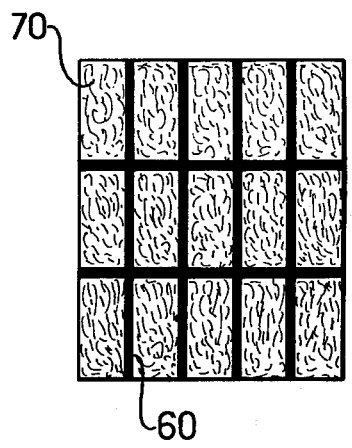
FIG. 7 shows a top view of the module.

FIG. 7 shows the top view of the module in FIG. 6.

All the junctions 70 are parallel to one another and come from the cutting up of the bridges 41, 42, ETC...

Figure 8:
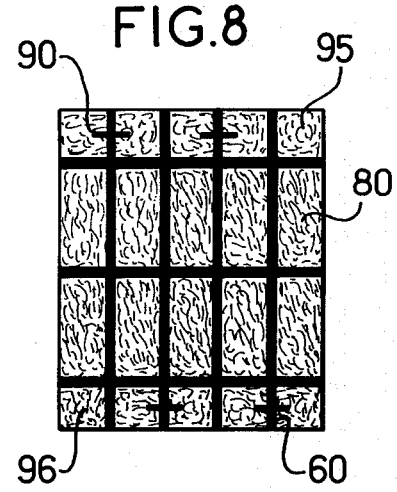
FIG. 8 shows a bottom view of the module.

FIG. 8 shows the bottom view of the module in FIG. 6.

The junctions 80, parallel to the junctions 70 come from the cutting up of the bridges 51, 52, etc.

The other junctions 90 orthogonal to the junctions 80 as well as the incoming and outgoing current terminals 95 and 96 must be formed manually by depositing brazing material.

According to a variant of the method described, the two faces 4 and 5 of the stack 3 are tin-plated before being immersed in the brazing material.

It is also possible to scour them before immersing them in the brazing material.

Although the means which have just been described appear to afford the greatest advantages for implementing the method according to the invention in a particular technical structure, it will be understood that various modifications may be made thereto without going beyond the scope of the invention and more particularly that previous tin-plating operation or the scouring may be effected at any stage previous to the immersing in a brazing material or replaced by any other equivalent previous operation making the adhering of the brazing material on the surface materials easier without being detrimental to their electrical or thermoelectrical properties.

We claim:

1. Method for manufacturing thermoelectric modules from blocks of P type and of N type, having a parallelepipedical shape and having the same dimensions, and including the steps of:

cutting each parallelepipedical block parallel to one of its faces into plates of P type and plates of N type;

assembling alternately the same number of plates of P type and of N type, after having inserted between the adjacent faces thereof very thin insulating sheets having the same dimensions as the plates, to form a stack (3);

cutting that stack into thin slices in a direction perpendicular to the faces of the P and N plates so as to form slices each composed of a series of rods of alternating P and N type;

forming a parallelepipedic stack by assembling in a parallel configuration a certain number of these slices, after having inserted between the adjacent faces thereof very thin insulating sheets, so as to place successively a slice beginning with a P rod then a slice beginning with an N rod;

characterized in that the insulating sheets (31); 32, 33, 34, 35) inserted between the P plates (11, 12, 13) and N plates (21, 22, 23) are arranged alternately so as to be substantially recessed in relation to the plates on one face (4) of the stack (3) and slightly protruding on the opposite face (5), and in that the said opposite faces (4, 5) of the said stack (3) from which the sheets (31, 32, 33, 34, 35) protrude are immersed in brazing material before said cutting of the stack (3).

2. Method for manufacturing thermoelectric modules according to claim 1, characterized in the parallelepipedical blocks (1, 2) of P type and N type, the two opposite faces which will be cut out in two perpendicular directions are previously tin-plated before the cutting up of the said blocks (1, 2) into plates.

3. Method for manufacturing thermoelectric modules according to claim 1, characterized in that the two faces (4, 5) of the stack (3) which are orthogonal to the P rods (8) and N rods (9) are tin-plated before being immersed in the brazing material.

4. Method for manufacturing thermoelectric modules according to claim 1, characterized in that the two faces (4, 5) of the stack (3) from which the insulating sheets (31, 32, 33, 34, 35) protrude are scoured before being immersed in the brazing material.

5. Method for manufacturing thermoelectric modules according to claim 1, characterized in that the insulating sheets (31, 32, 33, 34, 35) are constituted by a polyimide film coated with thermo-weldable polytetrafluorethylene withstanding brazing temperatures.

6. Method for manufacturing thermoelectric modules according to claim 5, characterized in that the insulating sheets (60) inserted between the slices (6) are previously coated with an epoxy cement, then pressed so as to remove any unrequired thickness of epoxy cement.

7. A thermoelectric module manufactured by the method defined in claim 1.

* * * * *